(12) United States Patent
Narazaki

(10) Patent No.: US 7,319,264 B2
(45) Date of Patent: Jan. 15, 2008

(54) SEMICONDUCTOR DEVICE

(75) Inventor: Atsushi Narazaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/276,668

(22) Filed: Mar. 9, 2006

(65) Prior Publication Data

US 2007/0001265 A1  Jan. 4, 2007

(30) Foreign Application Priority Data

Jul. 4, 2005  (JP) ............................. 2005-194828

(51) Int. Cl.
| H01L 29/00 | (2006.01) |
| H01L 27/102 | (2006.01) |
| H01L 27/082 | (2006.01) |
| H01L 29/70 | (2006.01) |
| H01L 23/50 | (2006.01) |

(52) U.S. Cl. ................ 257/578; 257/579; 257/502; 257/503; 257/E23.079

(58) Field of Classification Search ............. 257/48, 257/772, 774, 502–503, 578–579, E23.079
See application file for complete search history.

(56) References Cited

U.S. PATENT DOCUMENTS

| 5,843,798 A | * | 12/1998 | Matsuda ................ 438/106 |
| 6,294,837 B1 | * | 9/2001 | Akram et al. ............... 257/774 |
| 6,514,845 B1 | * | 2/2003 | Eng et al. ................. 438/613 |
| 6,522,017 B2 | * | 2/2003 | Horiuchi et al. ........... 257/778 |
| 7,037,819 B2 | * | 5/2006 | Gosselin et al. ........... 438/612 |
| 7,060,526 B2 | * | 6/2006 | Farnworth et al. ......... 438/106 |
| 2005/0161803 A1 | * | 7/2005 | Mihara ..................... 257/698 |
| 2005/0194692 A1 | * | 9/2005 | Windlass et al. ........... 257/774 |
| 2005/0224982 A1 | * | 10/2005 | Kemerling et al. ......... 257/758 |

FOREIGN PATENT DOCUMENTS

JP  2003-218155  7/2003

* cited by examiner

Primary Examiner—Luan Thai
(74) Attorney, Agent, or Firm—Oblon, Spivak, McClelland, Maier & Neustadt, P.C.

(57) ABSTRACT

A semiconductor device has a structure capable of connecting a lead terminal directly to an electrode on a front surface thereof. The semiconductor device includes a first main electrode provided on the front surface, a second main electrode provided on a back surface, and a metal film provided so as to cover at least a portion of a surface of the first main electrode and for soldering the lead terminal thereto. Here, the metal film includes a plurality of opening portions through which the surface of the first main electrode is exposed.

9 Claims, 20 Drawing Sheets

A-A' CROSS SECTION

SEMICONDUCTOR DEVICE

BACKGROUND

1. Field of the Invention

The present invention relates to a semiconductor device used for electric-power control utilizing a direct-lead-bonding method and, in particular, to a semiconductor-chip surface configuration.

2. Description of the Related Art

Currently, for power semiconductor devices used for electric power applications, such as power MOSFETs (Metal Oxide Semiconductor Field Effect Transistors) or IGBTs (Insulated Gate Bipolar Transistors), there has been a need for reduction of device resistances, in order to reduce the losses when applying current. As a method for realizing the aforementioned need, there has recently been employed a direct-lead-bonding method which directly connects leads to the semiconductor chip surface, instead of bonding methods using aluminum-wire bonding.

In general, semiconductor chips include electrodes made of an aluminum alloy. Accordingly, leads can not be directly connected to surfaces of the electrodes through soldering, and therefore a metal film containing nickel or the like which is connectable to solder is formed, in advance, on the aluminum alloy electrodes of the chips, through a vapor deposition method.

After the vapor-deposition of the metal film and before the soldering of the lead terminals, the chips are subjected to a process for performing screening tests by bringing probe needles into contact with the chip surface. This process is referred to as a probe test or a wafer test (hereinafter, referred to as the probe test). Typically, electric-power semiconductor devices are supplied with large electric currents during utilization. Therefore, during the probe test, a plurality of needles are brought into contact with the electrodes at the surfaces in order to flow a large electric current therethrough. Since surface electrodes are made of an aluminum alloy and are soft, then, deep probe-needle trances are left on the electrode aluminum alloy. In the case of semiconductor devices utilizing wire-bonding methods rather than the direct-lead-bonding method, even if needle trances are left, the damages at needle traces will not induce electric-field concentrations and stress concentrations during actual utilization after the assembly of the package and thus will induce no problem. However, in the case of utilizing the direct-lead-bonding method, leads are bonded through soldering, which causes intrusion of solder into needle trances. Conventionally, lead terminals have been bonded while allowing such intrusion of solder.

FIG. 38 is a plan view of a semiconductor device 50 suitable for the direct-lead-bonding method which is fabricated according to a conventional example. FIG. 39 is a plan view illustrating a semiconductor wafer 1 which has been subjected to processing steps until the final processing step, prior to the vapor deposition of the metal film. FIG. 40 is a plan view illustrating the back surface thereof. FIG. 41 is a plan view of a metal mask 7 for vapor-depositing the metal film on the emitter electrode 3 on a front surface. FIG. 42 is a schematic view illustrating the structure before the vapor deposition. FIG. 43 is a plan view of the semiconductor wafer 1 after the vapor deposition of the metal film 8 on the emitter electrode 3 on the front surface. FIG. 44 is a schematic view illustrating the needle contacting state during the probe test for the wafer. FIG. 45 is a cross-sectional view of FIG. 44. FIG. 46 is a plan view of the conventional semiconductor device 50 after the probe test, illustrating probe traces 11 left on the emitter electrodes 3 through the metal film 8. FIG. 47 is a partial cross-sectional view of an electric-power semiconductor product fabricated using the conventional semiconductor device 50. FIG. 48 is a partially enlarged cross-sectional view of the probe trace a on the surface of the emitter electrode 3 of the electric-power semiconductor product of FIG. 47.

The semiconductor device 50 according to the conventional configuration can be provided as follows.

(a) First, a semiconductor wafer 1 is prepared. For convenience, in this case, IGBTs which function as gate driving devices are used. The semiconductor wafer 1 has been subjected to the final step of wafer processing steps and, thus, a plurality of semiconductor chips 2 have been arranged on the semiconductor wafer 1. Each of the chips 2 includes an emitter electrode 3 and a gate electrode 4 which are both made of an aluminum alloy. Also, gate wiring 5 is provided for surrounding the emitter electrode 3. A collector electrode 6 is formed on the back surface of the semiconductor wafer 1 by use of a vapor deposition method or a sputtering method. Further, on the emitter electrode 3, a metal film 8 is selectively formed, by use of a vapor deposition method, over soldering regions required for bonding lead terminals thereto. In the present exemplary conventional structure, an alloy of Ti/Ni/Au is vapor-deposited on the emitter electrode 3. The Ti is for enhancing the ohmic characteristic with respect to the emitter electrodes 203, the Ni is an adhesive for bonding to the solder and the Au is an oxidation protection agent for the Ni.

(b) Thereafter, a probe test is conducted for the semiconductor wafer 1 for determining whether each of the chips is a non-defective product or a defective product and for attaching ink marks on the chip surfaces of defective chips. In a commonly conducted probe test, a plurality of probe needles 9 are brought into contact with the emitter electrode 3 and a single probe needle 9 is brought into contact with the gate electrode 4 while the collector electrode 6 on the back surface is contacted with a wafer stage 10 by use of vacuuming. Hereinafter, there will be described an exemplary category of tests for N-channel type IGBTs, by exemplifying ON-voltage measurements. First, a controlling voltage (for example, a gate-emitter voltage of +15V) is applied to the gate electrode 4 and a plus bias is applied to the collector electrode 6 on the back surface while the emitter electrode 3 is maintained at ground to generate an electric current flowing between the emitter electrode 3 and the collector electrode 6. Under this condition, the collector-emitter voltage for generating a certain electric current is defined as an ON-voltage and, thus, specification tests are conducted. In general, electric-power semiconductor devices have basic performance for control of large electric currents and, when applying current, a large electric current must be flowed therethrough. However, there is a limit to the amount of electric current which can be flowed through a single probe needle. Accordingly, a plurality of probe needles are brought into contact with the emitter electrode 3. The collector electrode 6 on the back surface is turned on over the entire wafer surface through the stage, which ensures provision of a sufficient electric current thereto.

(c) After the probe test, dicing is performed to cut off the chips 2. At this time, many probe traces 11 are left on the emitter electrodes 3 and the metal film 8. While the probe test is performed for a wafer in general, probe test may be performed for separated chips after dicing, in view of the working efficiency.

As described above, the fabrication of the semiconductor device 50 according to an exemplary conventional structure is completed.

In order to complete the fabrication of the electric-power semiconductor product as the final product, as illustrated in FIG. 47, the collector electrode 6 on the back surface is mounted on a substrate 13 through solder 12. Next, a lead terminal 14 made of Cu or the like is connected, through solder 15, to the metal film 8 on the emitter electrode 3, in the conventional semiconductor device 50. While in the present exemplary conventional structure an aluminum wire 16 is bonded to the gate electrode 4, the gate electrode 4 may be connected in the direct-lead method, similarly to the emitter electrode. Thereafter, a molded resin 17 for sealing is applied thereto to complete the fabrication of the electric-power semiconductor product.

Also, there have been known techniques for forming openings in an insulation film at the upper surface of chips and soldering aluminum wiring and the like to the regions, as shown in Japanese Patent Laid-open Publication No. JP2003-218155.

SUMMARY

In the case of the semiconductor device having the aforementioned structure, the lead terminals are directly connected through solder to the emitter electrode surface having needle traces caused by the probe test, which causes solder to intrude into the probe traces. Particularly, in the case where the aluminum alloy of the emitter electrode has a thickness of 3.6 μm and the metal film on the surface thereof has a thickness of about 0.3 μm in the exemplary conventional structure, the probe needles can easily penetrate through the metal film to reach the aluminum-alloy film of the emitter electrode. Accordingly, the metal film cannot serve as a film for preventing intrusion of solder. If solder has intruded into needle traces, the needle traces will suffer from local thermal stresses from the lead terminals during the soldering process. Since transistor cells are formed in the silicon region under the emitter electrodes in general, such thermal stresses will be directly applied to the transistors. Further, even when the semiconductor device does not become defective just after the soldering, subsequent reliability tests such as thermal cycles tend to cause thermal contraction stresses between the lead terminals and the silicon, which may influence on the transistors under the emitter electrodes. This may result in the occurrence of poor withstand voltages and gate malfunctions.

It is an object of the present invention to provide electric-power semiconductor devices capable of preventing intrusion of solder into probe traces caused by the probe test, preventing damages of transistor cells due to stresses generated during connection of lead terminals through soldering materials and during reliability tests, improving the yield and enabling provision of reliable electric-power semiconductor products.

A semiconductor device according to the present invention has a structure capable of connecting a lead terminal directly to an electrode on a front surface thereof, and includes a first main electrode provided on the front surface; a second main electrode provided on a back surface; and a metal film provided so as to cover at least a portion of a surface of the first main electrode and for soldering the lead terminal thereto, wherein the metal film has a plurality of opening portions through which the surface of the first main electrode is exposed.

With the semiconductor device according to the present invention, the pattern of the metal film formed on the emitter electrodes are modified to prevent intrusion of solder into probe traces created during the probe test for avoiding damages of transistor cells due to stresses generated during connection of lead terminals through soldering materials and during reliability tests.

BRIEF DESCRIPTION OF THE DRAWINGS

The present invention will become readily understood from the following description of preferred embodiments thereof made with reference to the accompanying drawings, in which like parts are designated by like reference numeral and in which.

DESCRIPTION OF THE PREFERRED EMBODIMENTS

Figure 1:
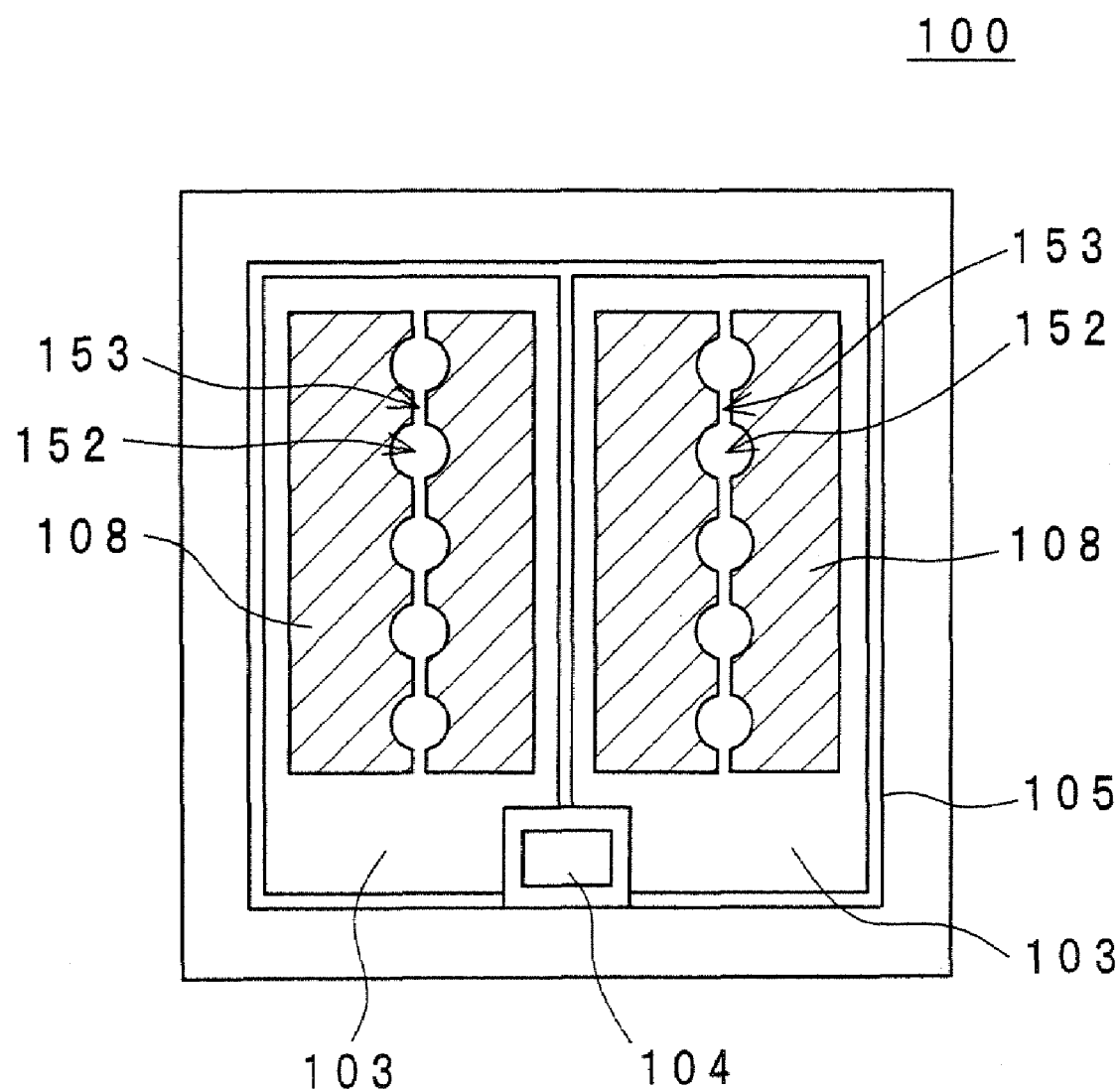
FIG. 1 is a plan view of a semiconductor device according to a first embodiment of the present invention.

The following describes semiconductor devices according to embodiments of the present invention, with reference to the drawings. In the drawings, components that are substantially the same are designated by the same reference numbers.

First Embodiment

Figure 2:
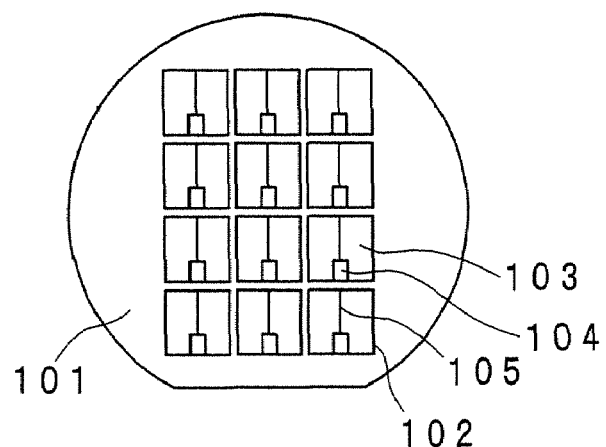
FIG. 2 is a plan view illustrating the semiconductor wafer of the semiconductor device according to the first embodiment of the present invention, prior to the vapor deposition of a metal film, during fabrication thereof.
Figure 3:
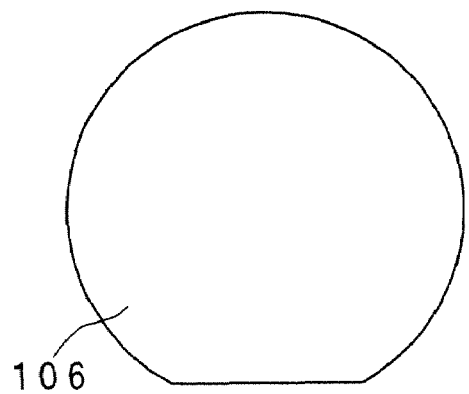
FIG. 3 is a view illustrating the semiconductor wafer of FIG. 2, from the back surface thereof.
Figure 4:
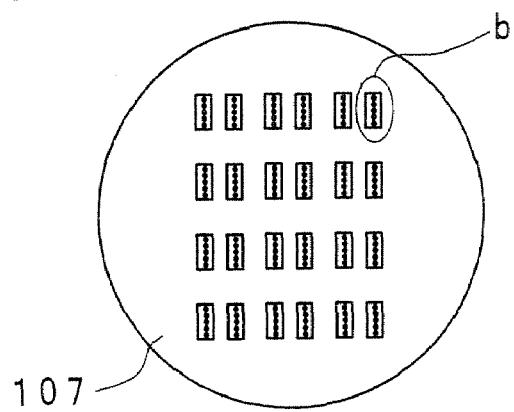
FIG. 4 is a plan view of a metal mask used for providing the semiconductor device according to the first embodiment of the present invention.
Figure 5:
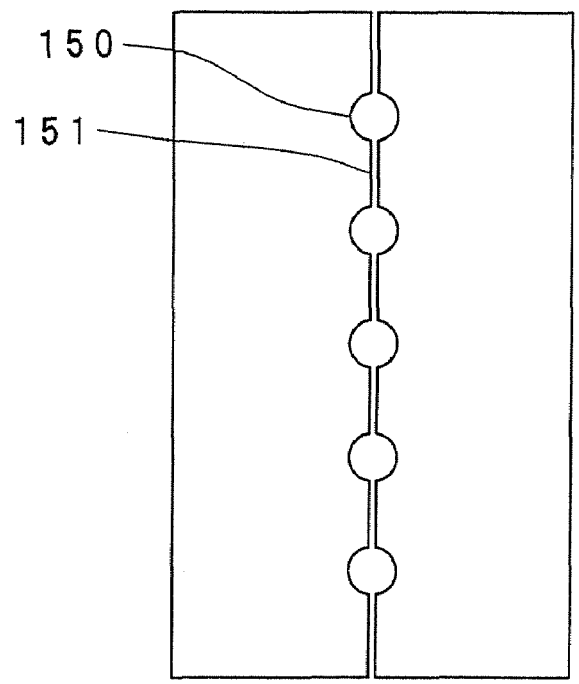
FIG. 5 is a partially enlarged view of the portion b of the metal mask of FIG. 4.
Figure 6:
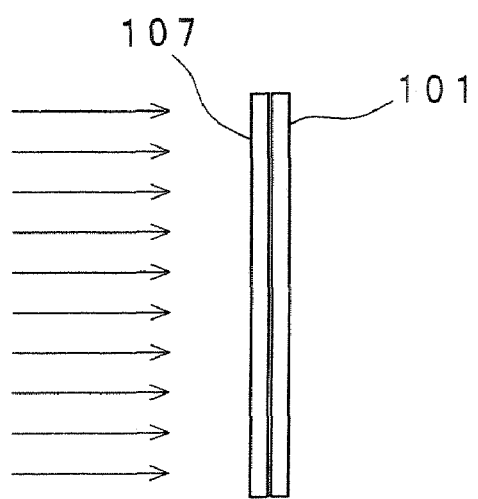
FIG. 6 is a schematic view illustrating the structure of the metal mask overlaid on the semiconductor wafer for vapor-depositing the metal film.
Figure 7:
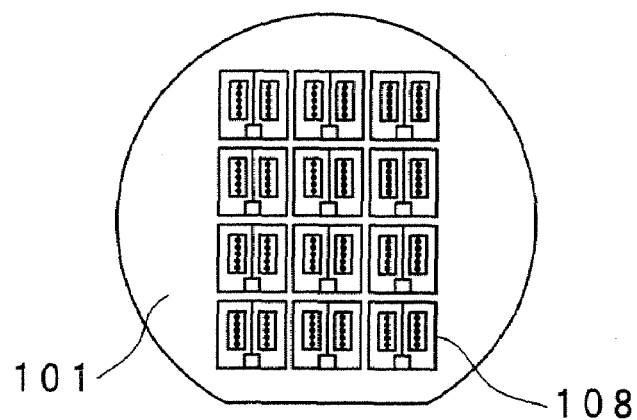
FIG. 7 is a plan view of the semiconductor wafer of the semiconductor device according to the first embodiment of the present invention, after the vapor deposition of a metal film, during fabrication thereof.
Figure 8:
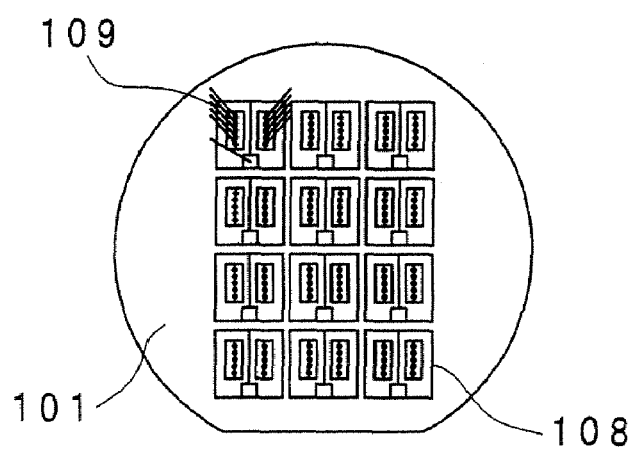
FIG. 8 is a schematic view illustrating the needle contact state of probe needles on the semiconductor wafer during the probe test.
Figure 9:
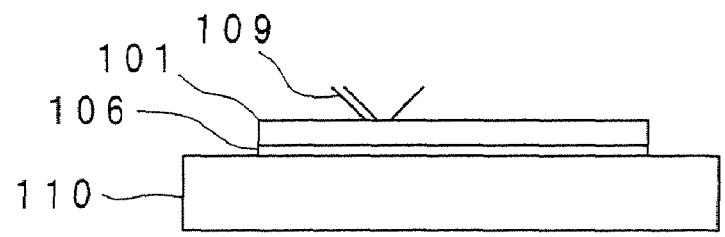
FIG. 9 is a cross-sectional view illustrating the needle contact state of FIG. 8.
Figure 10:
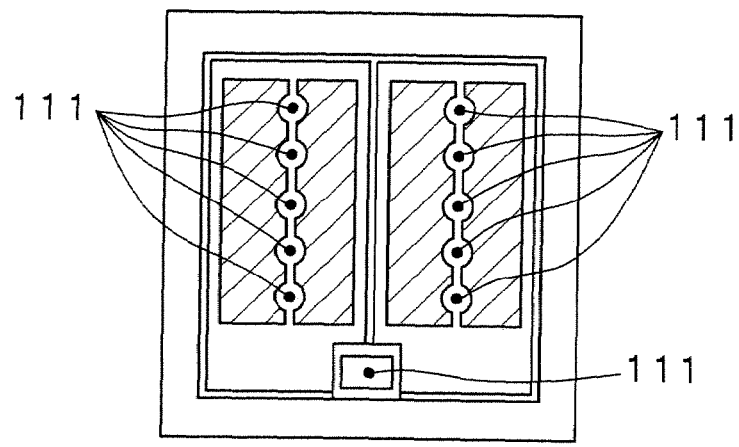
FIG. 10 is a plan view of the semiconductor device according to the first embodiment of the present invention, after the probe test.
Figure 11:
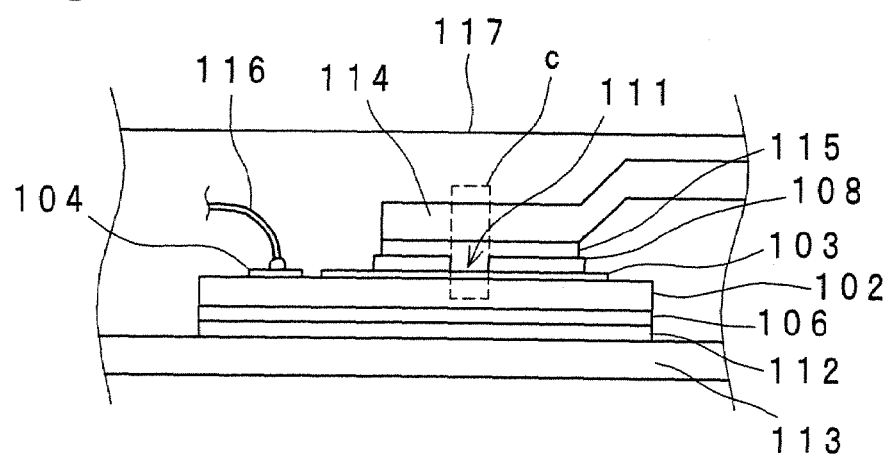
FIG. 11 is a partial cross-sectional view of an electric-power semiconductor product fabricated using the semiconductor device according to the first embodiment of the present invention.
Figure 12:
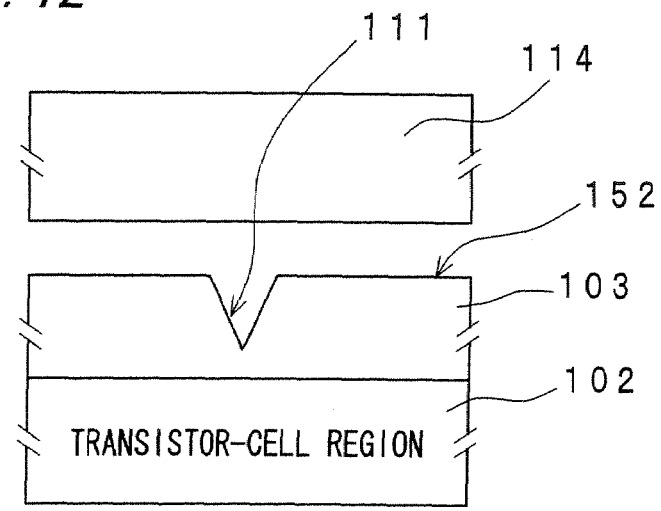
FIG. 12 is a partial cross-sectional enlarged view of the probe trance portion c of FIG. 11.

FIG. 1 is a plan view of a semiconductor device 100 suitable for the direct-lead-bonding method according to a first embodiment of the present invention. FIG. 2 is a plan view of a semiconductor wafer 101 which has been subjected to the final step of processing steps, prior to the vapor deposition of a metal film, and FIG. 3 is a plan view of a back surface of the semiconductor wafer 101. FIG. 4 is a plan view of a metal mask 107 for selectively vapor-depositing a metal film 108 on an emitter electrode 103 on a front surface of the semiconductor wafer 101. This metal mask 107 has a mask pattern modified for obtaining a pattern including opening portions of the metal film 108 of the semiconductor device 100. FIG. 5 is a partially-enlarged view of the portion b of the metal mask 107, illustrating modified portions. FIG. 6 is a schematic view illustrating the structure during the vapor deposition. FIG. 7 is a plan view illustrating the semiconductor wafer 101 after the vapor deposition of the metal film 108 on the emitter electrodes 103 on the front surface. FIG. 8 is a schematic view illustrating the needle contact state of probe needles 109 during the probe test at a wafer state. FIG. 9 is a cross-sectional view illustrating the needle contacting state of FIG. 8. FIG. 10 is a plan view of the semiconductor device 100 after the probe test, illustrating probe traces 111 left in opening portions 152 of the metal film 108 on the emitter electrodes 103. FIG. 11 is a cross-sectional view of an electric-power semiconductor product fabricated using the semiconductor device 100. FIG. 12 is a cross sectional view enlarging a probe-needle trace portion "c" on the emitter electrode 103 on a surface of the electric-power semiconductor product.

The semiconductor device 100 according to the present embodiment can be provided as follows.

(a) First, a semiconductor wafer 101 is prepared. For convenience, IGBTs which function as gate driving devices are used thereon. The semiconductor wafer 101 has been subjected to the final step of wafer processing steps and, thus, a plurality of semiconductor chips 102 have been arranged on the semiconductor wafer 101. Each of the chips 102 includes an emitter electrode 103 and a gate electrode 104 which are both made of an aluminum alloy. Also, a gate wiring 105 is provided for surrounding the emitter electrode 103. A collector electrode 106 is formed on the back surface of the semiconductor wafer 101 by use of a vapor deposition method or a sputtering method. Further, on the emitter electrode 103, a metal film 108 is selectively formed as soldering regions required for bonding lead terminals thereto, and the opening portions 152 are positioned partially where the metal film is not deposited. The metal film 108 is formed by use of a vapor deposition method.

As illustrated in FIG. 1, after attaching, on the semiconductor wafer 101, a metal mask 107 which includes opening regions selectively arranged and masking regions 150 for partially preventing vapor deposition, then, vapor deposition is performed so as to form the metal film 108 having the opening portions 152 on the emitter electrode 103. The masking regions 150 are regions with which probe needles 109 are brought into contact, during the probe test, after the vapor deposition. The exemplary metal mask 107 illustrated in FIG. 5 includes round-shaped masking regions 150 and also includes coupling regions 151 for coupling the respective masking regions 150 to one another. Although the coupling regions 151 are not essential in the present invention, they are required for physically coupling the round-shaped masking islands to one another. In the present embodiment, an alloy of Ti/Ni/Au is vapor-deposited on the emitter electrode 103. The Ti is used for enhancing the ohmic characteristic with respect to the emitter electrode, the Ni acts as an adhesive for bonding to the solder and the Au acts as an oxidation protection agent for the Ni.

(b) Thereafter, the probe test is conducted for the semiconductor wafer 101 for determining whether each of the chips is a non-defective product or a defective product, and for attaching ink marks on the chip surfaces of defective chips. In a commonly conducted probe test, two or more probe needles 109 are brought into contact with the emitter electrode 103, and a single probe needle 109 is brought into contact with the gate electrode 104, while the collector electrode 106 on the back surface is contacted with a wafer stage 110 by use of vacuuming.

(c) After the probe test, dicing is performed to cut off the chips 102. Although, at this time, many probe traces 111 are left on the emitter electrode 103 and the metal film 108, in the present embodiment masking is applied in advance to the regions with which the probe needles are to be brought into contact and, thus, the metal film 108 is designed to have the round-shaped opening portions 152 where the metal film 108 is not vapor-deposited. It is noted that the coupling regions 153 are also left as non-deposited regions during the vapor deposition, they are not essential for providing the effects of the present invention. If the coupling regions 151 of the metal mask 107 are sufficiently narrow, such coupling regions 153 may not be formed due to intrusion of materials during the vapor deposition.

As described above, the semiconductor device 100 according to the present embodiment can be provided.

The chips determined to be non-defective products from the probe test are mounted on a substrate 113, at the collector electrode 106 on the back surface, through solder 112, as illustrated in FIG. 11. Next, a lead terminal 114 made of Cu or the like is connected, through solder 115, to the metal film 108 on the emitter electrode 103, in the semiconductor device 100 fabricated according to the present embodiment. In the present embodiment, even though an aluminum wire 116 is bonded to the gate electrode 104, the gate electrode 104 may be connected in the direct-lead method, similarly to the emitter electrode 103. Thereafter, a molded resin 117 for sealing is applied thereto to complete the fabrication of the electric-power semiconductor product using the semiconductor device 100 according to the present embodiment.

The semiconductor device 100 configured as described above can prevent the probe needles 109 from coming into direct contact with the metal film 108 during the probe test, so that the formation of probe traces on the metal film 108 can be prevented, and the entry of solder into the probe traces 111 during soldering of the lead terminal 114 in assembling of the product can be prevented. Consequently, the probe traces will not locally suffer from thermal stresses from the lead terminal during the soldering process, and the transistor cells under the emitter electrode 103 will not be damaged. Even in the event of the occurrence of thermally-induced contraction stresses during subsequent reliability tests such as thermal cycles, it is possible to prevent poor withstand voltages or gate malfunctions, since no solder has intruded into the probe traces 111.

Second Embodiment

Figure 13:
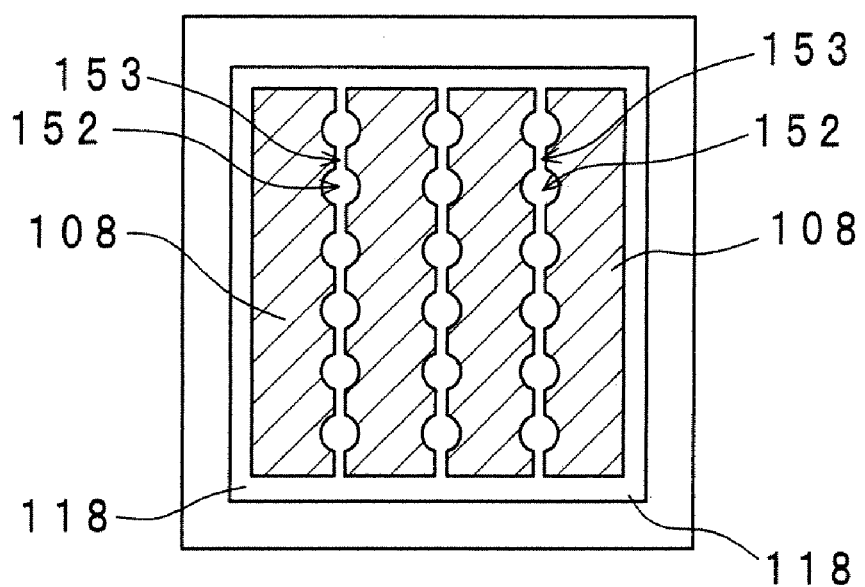
FIG. 13 is a plan view of a semiconductor device according to a second embodiment of the present invention.
Figure 14:
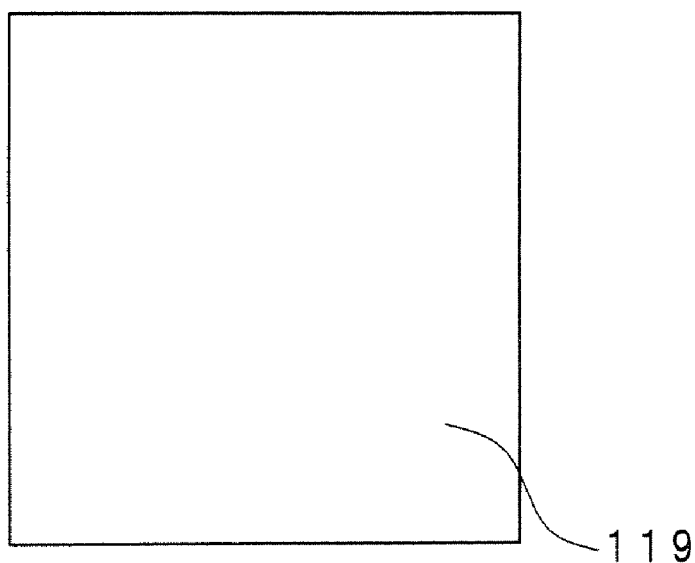
FIG. 14 is a plan view illustrating the back surface of the semiconductor device of FIG. 13.

A semiconductor device according to the second embodiment of the present invention is different from the semiconductor device according to the first embodiment in that the mounted semiconductor device includes no control electrodes as a diode device and includes only main electrodes, as illustrated in FIG. 13 and FIG. 14. Even in the case where no controlling gate electrodes exist as surface electrodes, the present invention is also effective, and the same effects can be provided. In this case, the semiconductor device includes, as main electrodes, an anode electrode 118 on the front surface and a cathode electrode 119 on the back surface.

Third Embodiment

Figure 15:
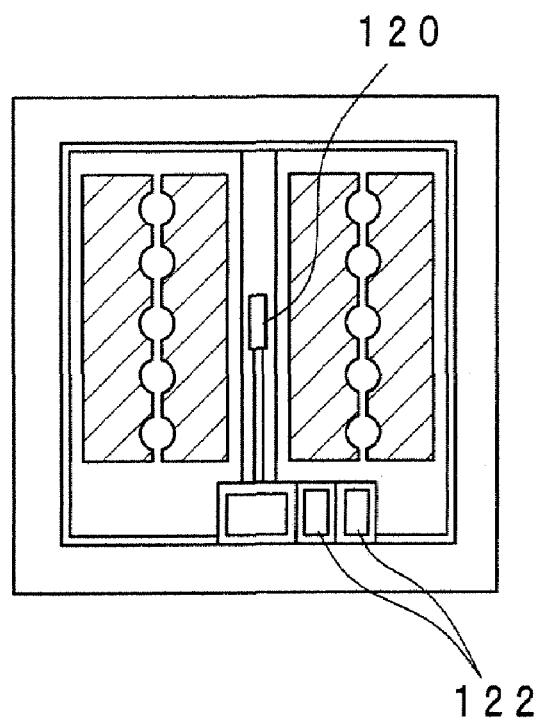
FIG. 15 is a plan view of a semiconductor device according to a third embodiment of the present invention.

A semiconductor device according to the third embodiment of the present invention is different from the semiconductor device according to the first embodiment in that there is disposed an optional device other than the electric-power semiconductor device and, thus, more than one controlling electrode exists as illustrated in FIG. 15. Even in the case where a plurality of controlling gate electrodes exist as surface electrodes as described above, the present invention is also effective and, the same effects as those of the first embodiment can be provided. This semiconductor device includes a temperature sensing device 120, as an optional device.

Fourth Embodiment

Figure 16:
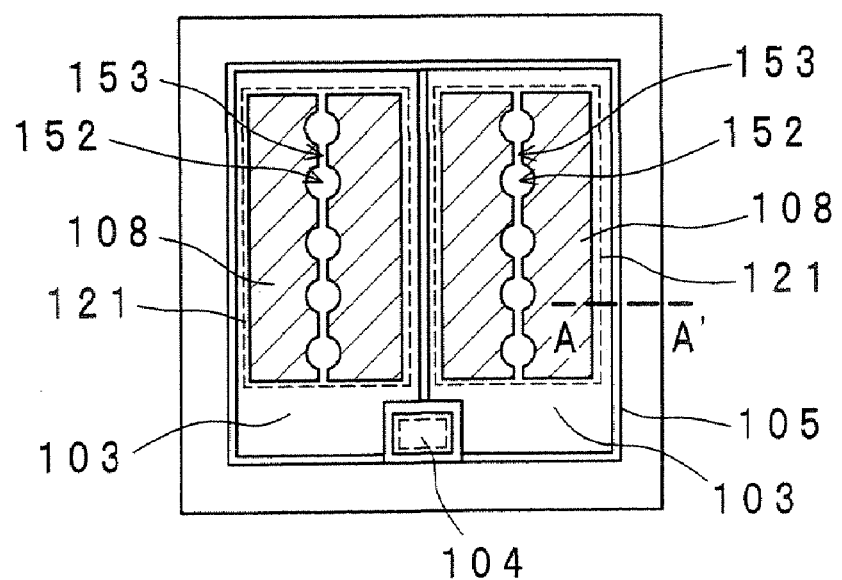
FIG. 16 is a plan view of a semiconductor device according to a fourth embodiment of the present invention.
Figure 17:
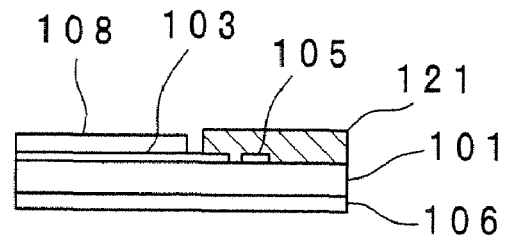
FIG. 17 is a cross-sectional view taken along the line A-A' of FIG. 16.

FIG. 16 is a plan view of a semiconductor device according to a fourth embodiment of the present invention, and FIG. 17 is a cross-sectional view taken along the line A-A' in FIG. 16. This semiconductor device is different from the semiconductor device 1 according to the first embodiment in that an insulating protective film 121 made of polyimide or the like is formed on the regions of a surface of the emitter electrode 103 which are not covered with the metal film 108, as illustrated in FIG. 16. In the aforementioned first embodiment, nothing is provided on the regions of the surface of the emitter electrode 103 other than the region where the metal film 108 is formed. On the other hand, in this embodiment, the regions can be protected from external environment by providing the protective film 121 as described above. As illustrated in FIG. 16, even in the case of forming a protective film such as the polyimide 121, it is possible to provide the same effects as those of the first embodiment. By providing the protective film, it is also possible to prevent damages due to flying solder during bonding of the lead terminal.

Fifth Embodiment

Figure 18A:
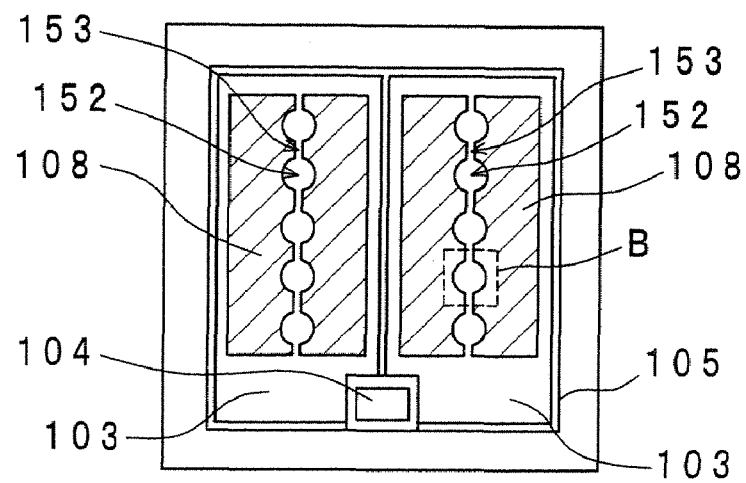
FIG. 18A is a plan view of a semiconductor device according to a fifth embodiment of the present invention and FIG. 18B is an enlarged view of the portion B of FIG. 18A.
Figure 18B:
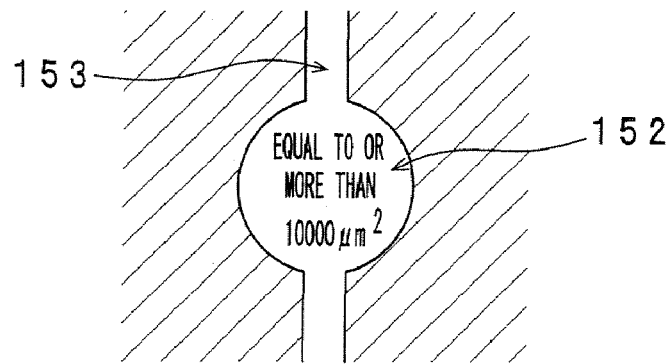
Figure 19A:
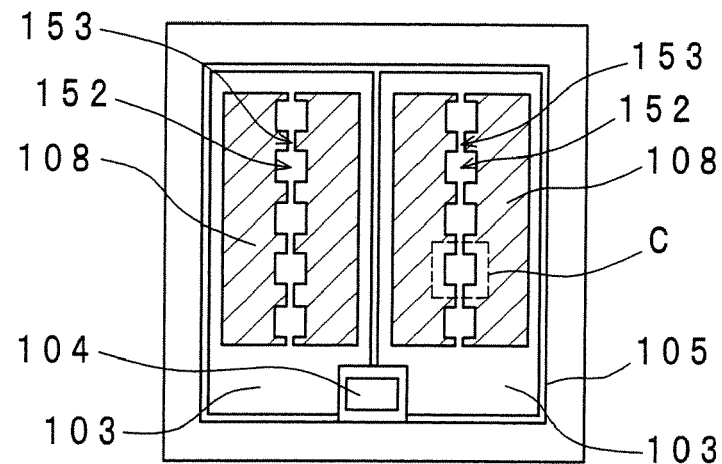
FIG. 19A is a plan view of a semiconductor device according to another example of the fifth embodiment of the present invention and FIG. 19B is an enlarged view of the portion C of FIG. 19A.
Figure 19B:
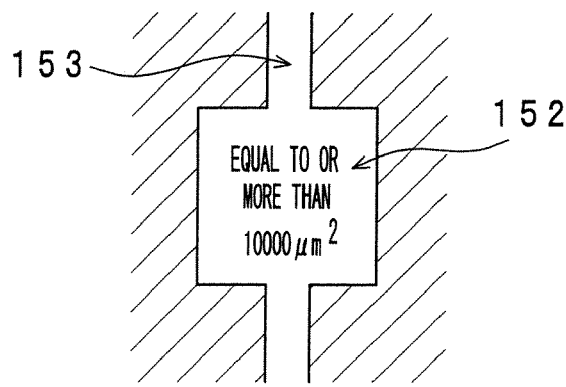

FIG. 18A is a plan view of a semiconductor device according to a fifth embodiment of the present invention, and FIG. 18B is an enlarged view of the portion B in FIG. 18A. FIG. 19A is a plan view of a semiconductor device according to another example of the fifth embodiment, and FIG. 19B is an enlarged view of the portion C in FIG. 19A. This semiconductor device is different from the semiconductor device according to the first embodiment in that the area of the opening portions is limited. In the semiconductor device, the area of the round-shaped opening portion is limited to equal to or greater than 10,000 μm². In view of the accuracy of positioning of probe needles during the probe test, it is preferable to ensure an area of the opening portion of equal to or greater than 10,000 μm². The aforementioned limitation on the area of the round-shaped opening regions 152 may be applied to rectangular-shaped opening portions 154 as illustrated in FIGS. 19A and 19B, as well as to round-shaped opening portions. In such a case, the present invention may also provide the same effects and, it is preferable to ensure an area of the opening portion of equal to or greater than 10,000 μm².

Sixth Embodiment

Figure 20:
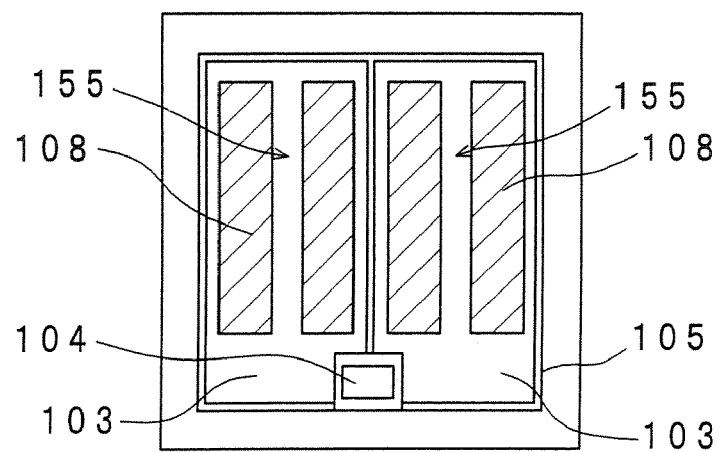
FIG. 20 is a plan view of a semiconductor device according to a sixth embodiment of the present invention.

FIG. 20 is a plan view illustrating the structure of a semiconductor device according to a sixth embodiment of the present invention. This semiconductor device is different from the semiconductor devices according to the first to fifth embodiments in that the metal film 108 covering the emitter electrode 103 has rectangular opening portions 155 in continuity with one another, then, the metal film 108 is separated in a straight line shape. The probe needles come into contact with the regions during the probe test. While the aforementioned metal films 108 have, for example, round shaped or rectangular shaped opening portions, in this semiconductor device the metal film is separated into straight-line shapes, instead of having undulations, as illustrated in FIG. 20. In this case, there are provided the same effects as those of the first embodiment and also, there is provided the advantage of easiness of working of the metal mask 107.

Seventh Embodiment

Figure 21:
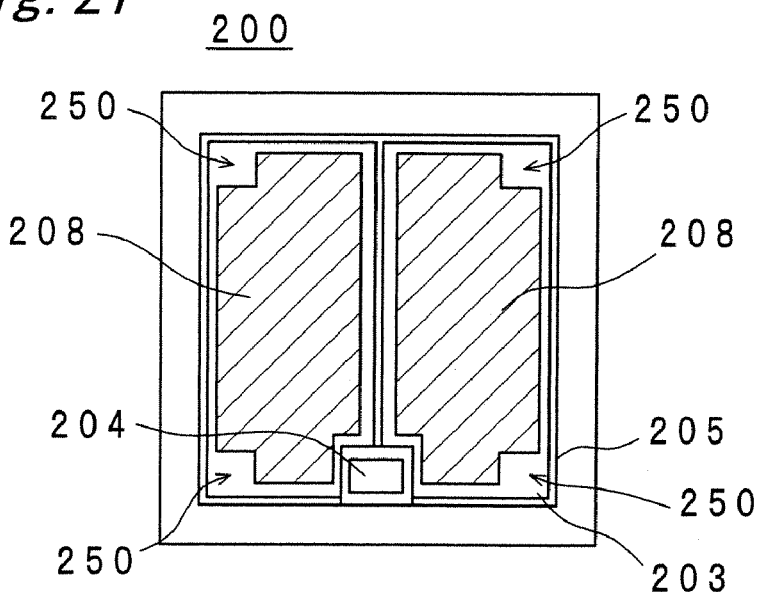
FIG. 21 is a plan view of a semiconductor device according to a seventh embodiment of the present invention.
Figure 22:
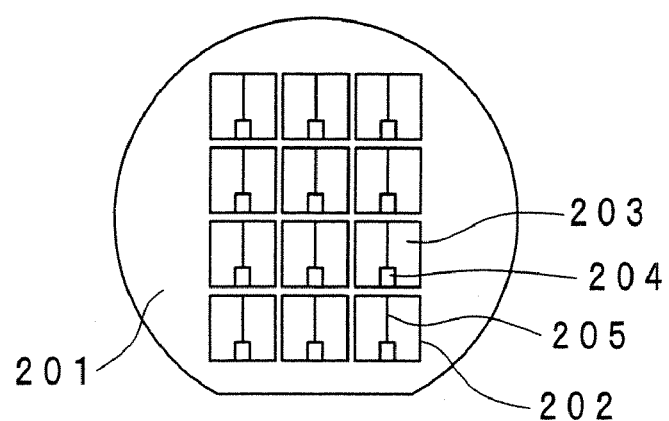
FIG. 22 is a plan view of the semiconductor wafer of the semiconductor device according to the seventh embodiment of the present invention, before the vapor deposition of a metal film, during fabrication thereof.
Figure 23:
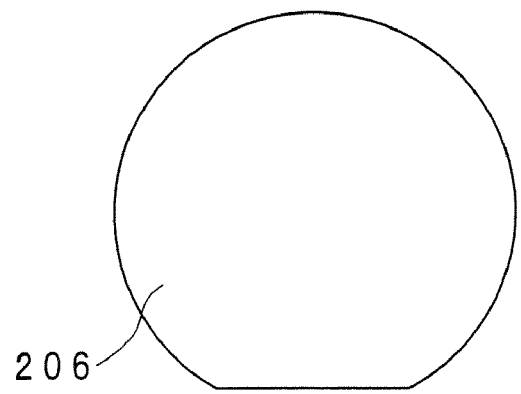
FIG. 23 is a plan view illustrating the back surface of the semiconductor wafer of FIG. 22.
Figure 24:
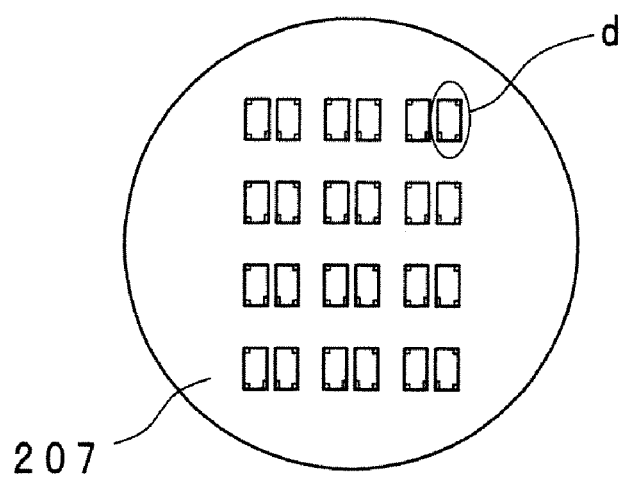
FIG. 24 is a plan view of a metal mask used for providing the semiconductor device according to the seventh embodiment of the present invention.
Figure 25:
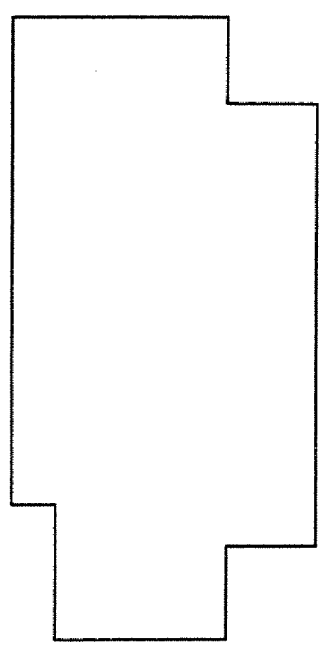
FIG. 25 is a partially enlarged view of the portion d of the metal mask of FIG. 24.
Figure 26:
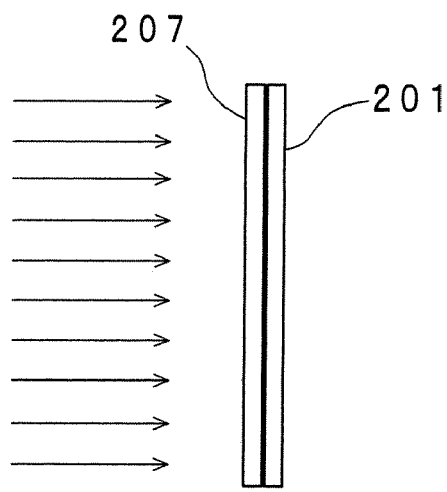
FIG. 26 is a schematic view illustrating the structure of the metal mask overlaid on the semiconductor wafer for vapor-depositing the metal film.
Figure 27:
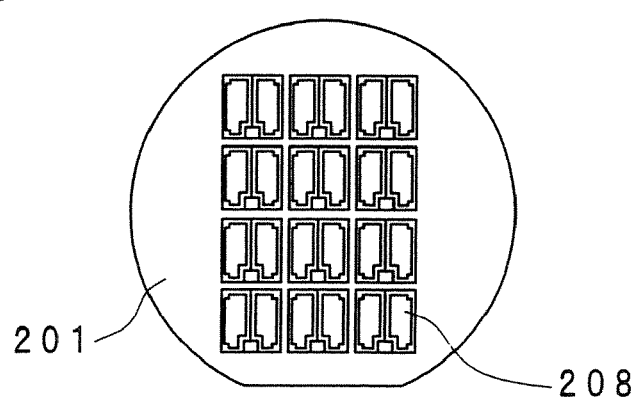
FIG. 27 is a plan view of the semiconductor wafer of the semiconductor device according to the seventh embodiment of the present invention, after the vapor deposition of a metal film, during fabrication thereof.
Figure 28:
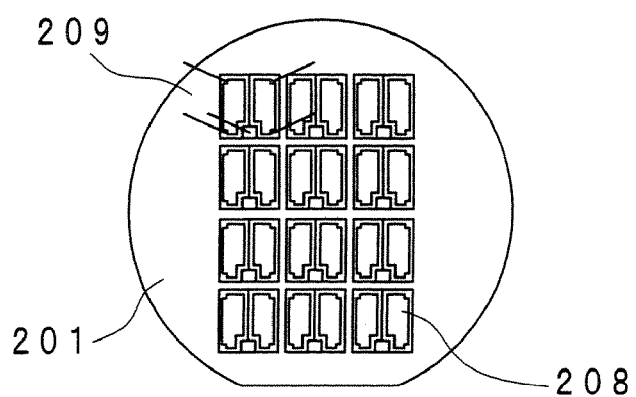
FIG. 28 is a schematic view illustrating the needle contact state of probe needles on the semiconductor wafer during the probe test.
Figure 29:
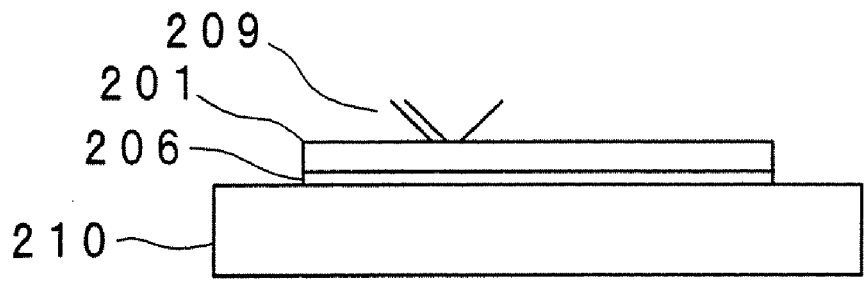
FIG. 29 is a cross-sectional view illustrating the needle contact state of FIG. 28.
Figure 30:
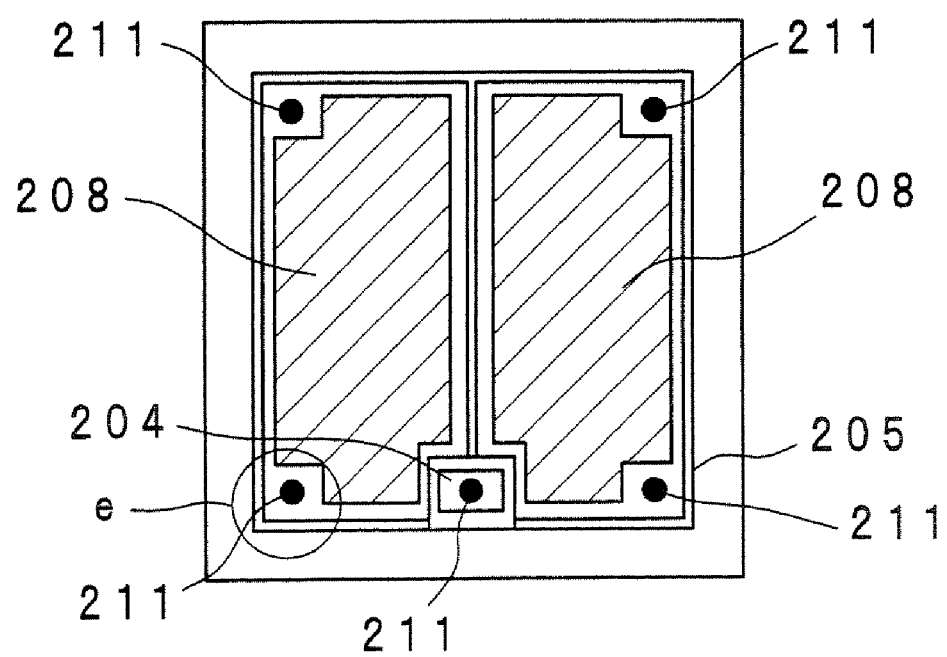
FIG. 30 is a plan view of the semiconductor device according to the seventh embodiment of the present invention, after the probe test.
Figure 31:
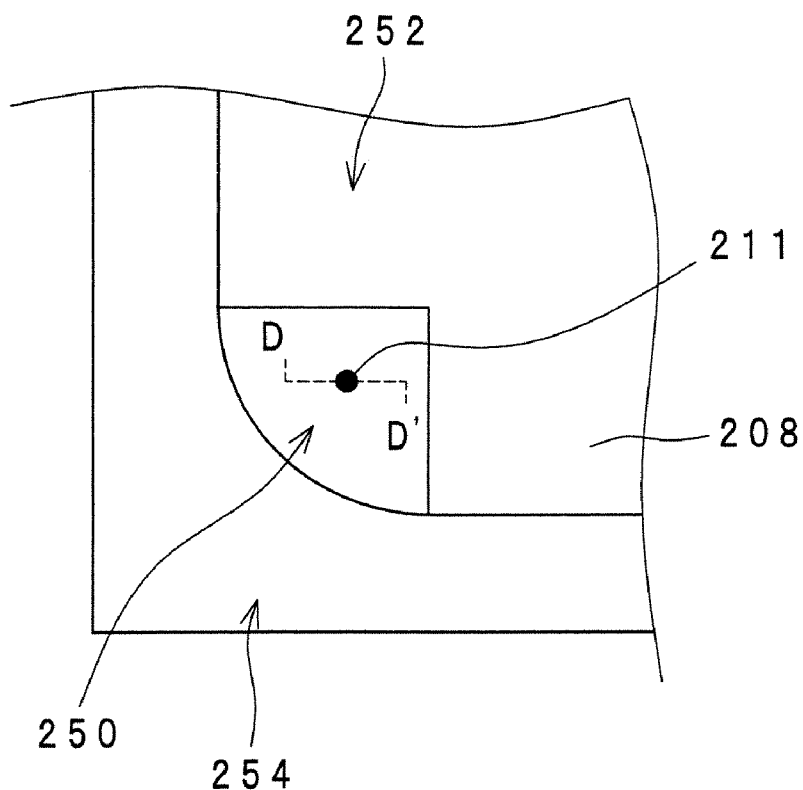
FIG. 31 is an enlarged view of the corner portion e of FIG. 30.
Figure 32:
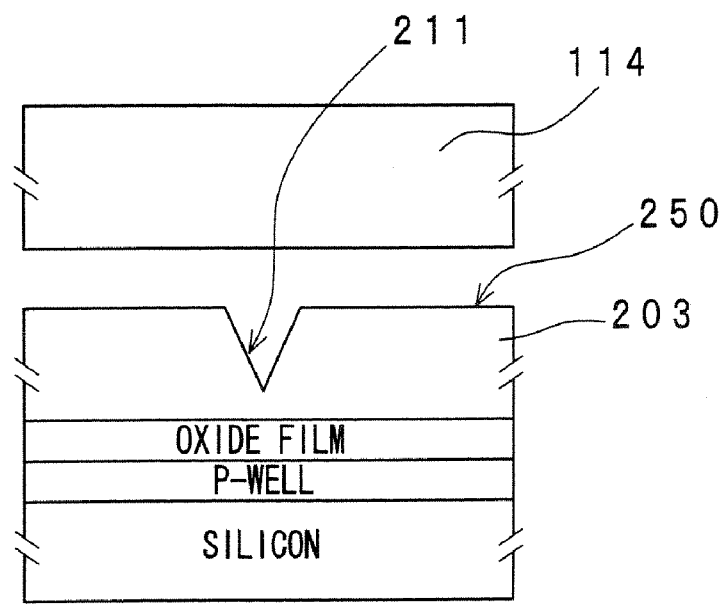
FIG. 32 is a cross-sectional view taken along the line D-D' of FIG. 31.

FIG. 21 is a plan view of a semiconductor device 200 suitable for the direct-lead bonding method according to a seventh embodiment of the present invention. FIG. 22 is a plan view illustrating a semiconductor wafer 201 which has been subjected to the final step of processing steps, prior to the vapor deposition of a metal film. FIG. 23 is a plan view illustrating the back surface thereof. FIG. 24 is a plan view of a metal mask 207 for selectively vapor-depositing a metal film 208 on emitter electrodes 203 on the front surface. The metal mask 207 has a mask pattern modified for providing the semiconductor device 200. FIG. 25 is a partially enlarged view of the portion d illustrating modified portions of the metal mask 207 of FIG. 24. FIG. 26 is a schematic view illustrating the structure during the vapor deposition, and FIG. 27 is a plan view of the semiconductor wafer 201 after the vapor deposition of the metal film 208 on the emitter electrodes 203 on the front surface. FIG. 28 is a schematic view illustrating a needle contact state of probe needles 209 during the probe test at a wafer state, and FIG. 29 is a cross-sectional view illustrating the needle contact state. FIG. 30 is a plan view of the semiconductor device after the probe test, illustrating probe traces 211 left on the corner portions 250 of the emitter electrodes 203. FIG. 31 is a partially enlarged view of the corner portion "e". It is noted that transistor cells are placed in a transistor-cell placement region 252 under the emitter electrodes 203 while no transistor cell is placed at the corner portions 250. Further, termination regions 253 are provided outside of the emitter electrodes 203. FIG. 32 is a cross-sectional view taken along the line D-D', illustrating the probe trace 211 in FIG. 31.

The semiconductor device 200 according to the present embodiment can be provided as follows.

(a) First, a semiconductor wafer 201 is prepared. In this case, IGBTs which are gate driving devices are used thereon, for convenience. The semiconductor wafer 201 has been subjected to the final step of wafer processing steps and, thus, a plurality of semiconductor chips 202 have been arranged on the semiconductor wafer 201. Each of the chips 202 includes an emitter electrode 203 and a gate electrode 204 which are both made of an aluminum alloy. Also, a gate wiring 205 is provided for surrounding the emitter electrode 203. A collector electrode 206 is formed on the back surface of the semiconductor wafer 201 by use of a vapor deposition method or a sputtering method. Further, on the emitter electrodes 203, a metal film 208 is selectively formed as soldering regions required for bonding lead terminals thereto, then there are partially provided, at the corner portions of the emitter electrodes 203, regions 250 where the metal film is not deposited. The metal film 208 is formed by use of a vapor deposition method. Further, no transistor cells are placed in the regions 250 under the emitter electrodes 203.

As illustrated in FIG. 21, in order to form the metal film 208 on the regions of the emitter electrodes 203 other than the corner portions 250, vapor deposition is performed by attaching a metal mask 207 on the semiconductor wafer 201. In this case, the corner regions 250 of the emitter electrodes 230 are masked by the metal mask 207 since the corner regions 250 are regions with which the probe needles 209 are brought into contact during the probe test. The exemplary metal mask 207 illustrated in FIG. 25 includes an outermost profile line having at least one recessed portion. While in the example of FIG. 25 the regions 250 where the metal film 208 is not vapor-deposited are formed as the recessed portions of the outermost profile line of the metal film 208, the regions 250 are not limited thereto and the metal film 208 may be formed with the corner portions of the surface of the emitter electrode 203 being exposed. In the present embodiment, an alloy of Ti/Ni/Au is vapor-deposited on the emitter electrodes 203 as the metal film 208. The Ti is used for enhancing the ohmic characteristic with respect to the emitter electrodes 203, the Ni acts as an adhesive for bonding to the solder and the Au acts as an oxidation protection agent for the Ni.

(b) Thereafter, the probe test is conducted for the semiconductor wafer 201 for determining whether each of the chips is a non-defective product or a defective product and for attaching ink marks on the chip surfaces of defective chips. In a commonly conducted probe test, a plurality of probe needles 209 are brought into contact with the emitter electrode 203 and a single probe needle 209 is brought into contact with the gate electrode 204 while the collector electrode 206 on the back surface is contacted with a wafer stage 210 by use of vacuuming. In the present embodiment, the probe needles 209 are brought into contact with the emitter electrode 203 through at least one of the corner portions 250.

(c) After the probe test, dicing is performed to cut off the chips 202.

As described above, the semiconductor device 200 according to the present embodiment can be provided.

After this, the same assembling processes as those of the first embodiment are performed to complete the fabrication of the electric-power semiconductor product.

The semiconductor device 200 configured as described above enables bringing the probe needles 209 into contact with the corner portion 250 of the emitter electrodes 203 where the metal film 208 is not deposited while preventing the probe needles 209 from contacting with the metal film 208, during the probe test. Accordingly, probe traces 211 are left only on the corner portions 250 while no probe trace is created on the metal film 208, which can prevent intrusion of solder into probe traces during the soldering of the lead terminals in assembly of the product. This can prevent thermal stresses from the lead terminals. Since no transistor is placed under the corner portions 250, even in the event of damages therein, this will not cause malfunctions. Further, since no transistor is formed in the corner portions 250, there is provided the advantage of improvement of the electrical breakdown strength against non-uniform operations of transistors in the corner portions 250.

Eighth Embodiment

Figure 33:
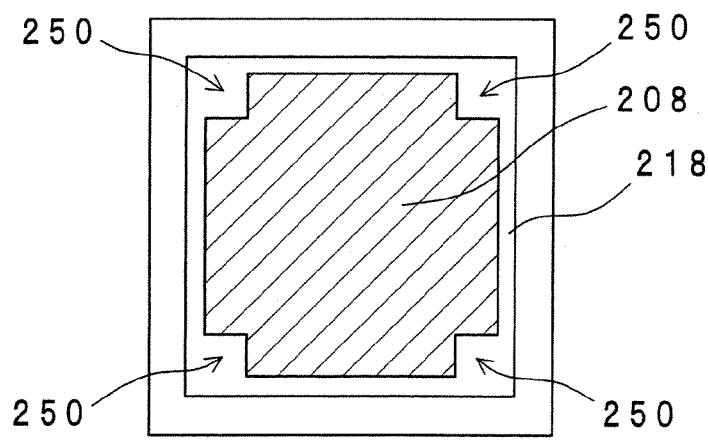
FIG. 33 is a plan view of a semiconductor device according to an eighth embodiment of the present invention.
Figure 34:
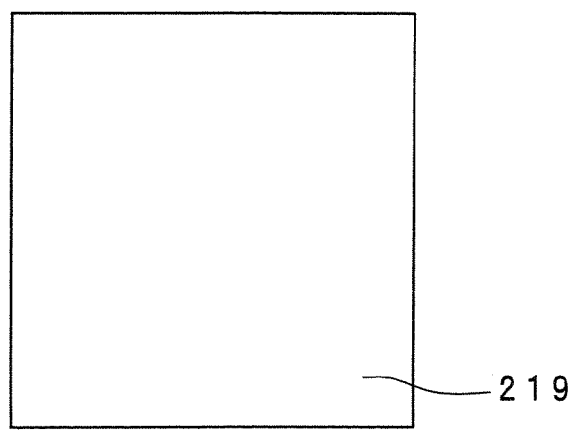
FIG. 34 is a plan view illustrating the back surface of the semiconductor device of FIG. 33.

FIG. 33 is a plan view illustrating the structure of a semiconductor device according to an eighth embodiment of the present invention and FIG. 34 is a plan view illustrating the back surface of FIG. 33. This semiconductor device is different from the semiconductor device according to the seventh embodiment in that it does not include a controlling electrode (gate electrode 204) and includes only an anode electrode 218. This semiconductor device includes, as main electrodes, the anode electrode 218 on the front surface and a cathode electrode 219 on the back surface, as illustrated in FIG. 33 and FIG. 34. In the case of the semiconductor device which does not have a controlling electrode as diode electrodes and includes only main electrodes, by preventing the deposition of the metal film 208 on the corner portions 250 and by bringing the probe needles 209 into contact with the corner portions 250 during the probe test, it is also possible to provide the same effects as those of the seventh embodiment.

Ninth Embodiment

Figure 35:
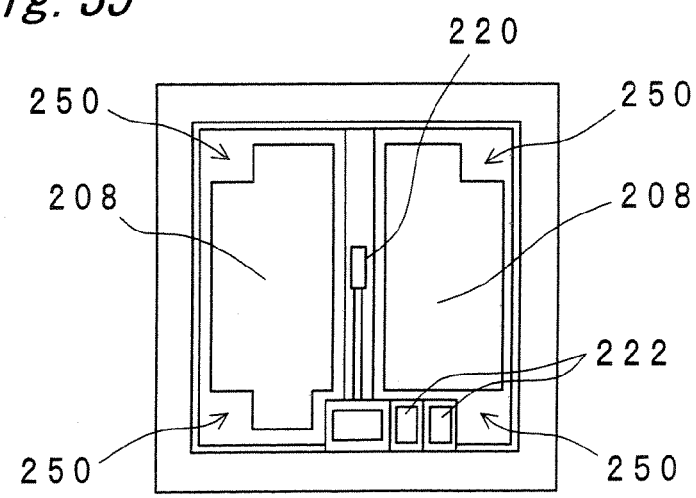
FIG. 35 is a plan view illustrating the structure of a semiconductor device according to a ninth embodiment of the present invention.

FIG. 35 is a plan view illustrating the structure of a semiconductor device according to a ninth embodiment of the present invention. This semiconductor device is different from the semiconductor device according to the seventh embodiment in that there is placed an optional device or the like other than the electric-power semiconductor device and, therefore, a plurality of controlling electrodes exist on the front surface, as illustrated in FIG. 35. It is also possible to provide the same effects as those of the seventh embodiment, even in the case where a plurality of controlling electrodes exist as electrodes on the front surface. This semiconductor device includes a temperature sensing device 120 as an optional device, as illustrated in FIG. 35.

Tenth Embodiment

Figure 36:
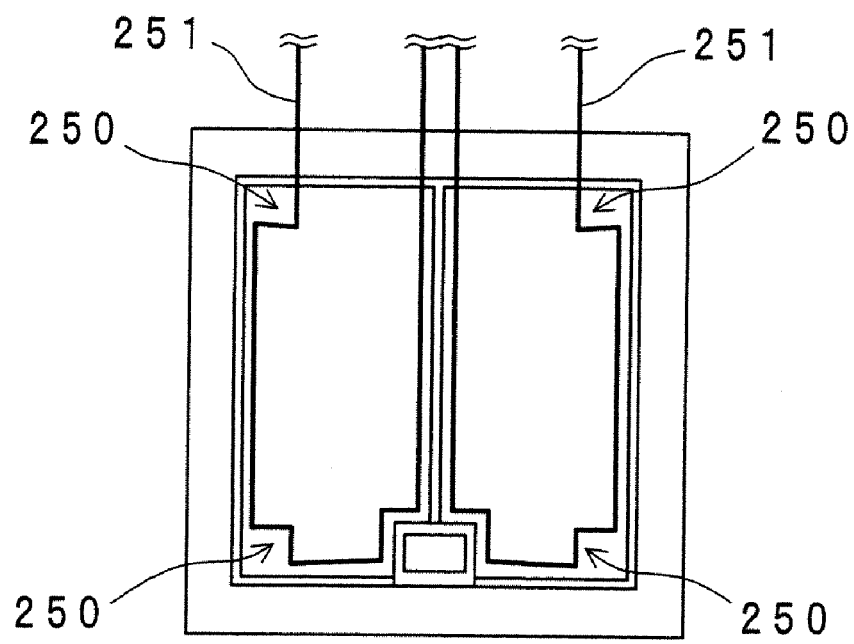
FIG. 36 is a plan view illustrating the structure of a semiconductor device according to a tenth embodiment of the present invention.

FIG. 36 is a plan view illustrating the structure of a semiconductor device according to a tenth embodiment of the present invention. This semiconductor device is different from the semiconductor devices according to the seventh to ninth embodiments in that lead terminals 251 soldered to the metal film 208 on the emitter electrodes 203 are wired such that they do not cover the corner portions 250 where the metal film is not deposited. In order to prevent the lead terminals 251 from covering the corner portions 250, the lead terminals 251 may be formed to have the same profile line as the outermost profile line of the metal film 208, as illustrated in FIG. 36. By wiring the lead terminals 251 such that they do not cover the corner portions 250, even if solder is flowed into the corner portions 250 when an excessive amount of solder is provided, no lead frame will exist on the solder, thus preventing generation of thermal contraction stresses between the lead terminals 251 and the silicon.

Modified Embodiments (1) While, in the aforementioned embodiments, the vapor-deposited metal films 108 and 208 are made of only Ti/Ni/Au, it is also possible to employ other materials such as Al/Mo/Ni/Au and Al/Ti/Ni/Au, in order to improve the ohmic characteristic with respect to the emitter electrodes.

(2) While, in the aforementioned embodiments, there have been exemplified only IGBTs and diodes as electric-power semiconductor devices, it is possible to employ any other electric-power semiconductor devices having electrodes on their chip surface, such as MOSFETs or CSTBTs which are other types of power semiconductor devices.

Figure 37:
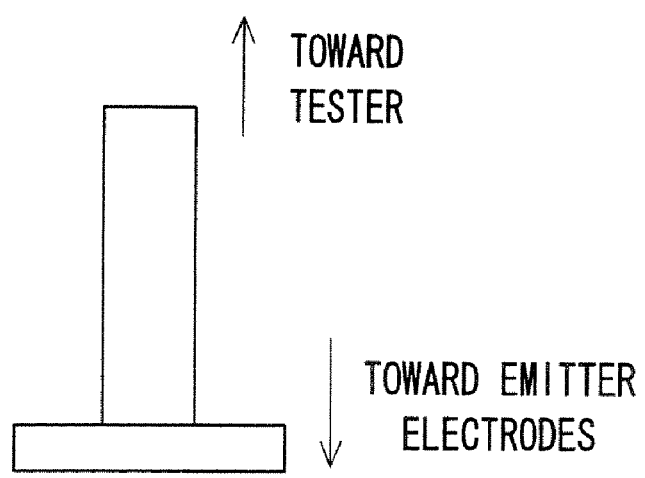
FIG. 37 is a schematic view of a pin-type probe as a modified embodiment.
Figure 38:
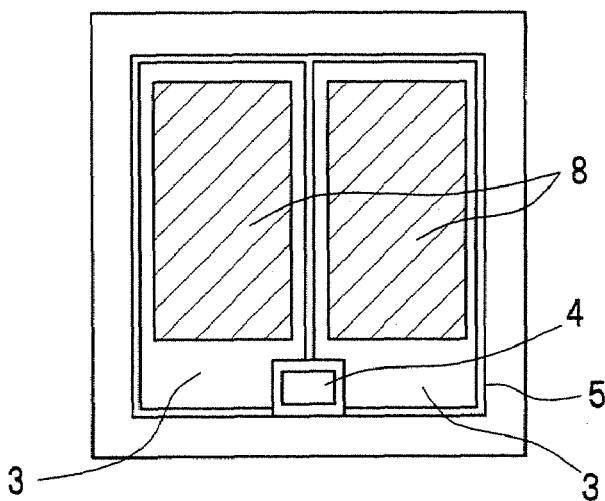
FIG. 38 is a plan view illustrating the structure of a conventional semiconductor device.
Figure 39:
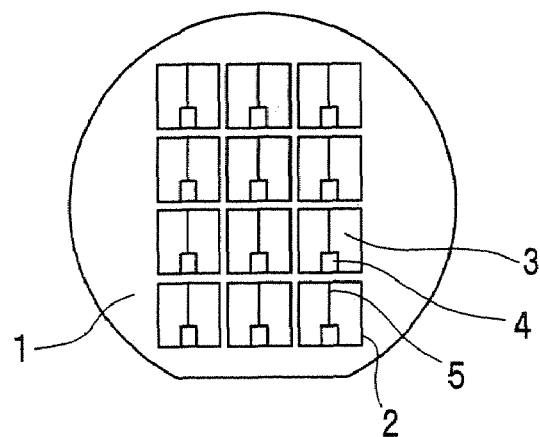
FIG. 39 is a plan view of the semiconductor wafer of the conventional semiconductor device, before the vapor deposition of a metal film, during fabrication thereof.
Figure 40:
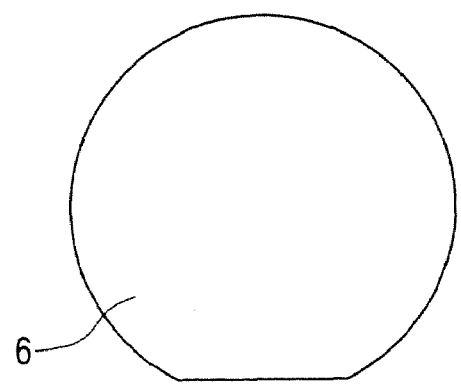
FIG. 40 is a plan view illustrating the back surface of the semiconductor wafer of FIG. 39.
Figure 41:
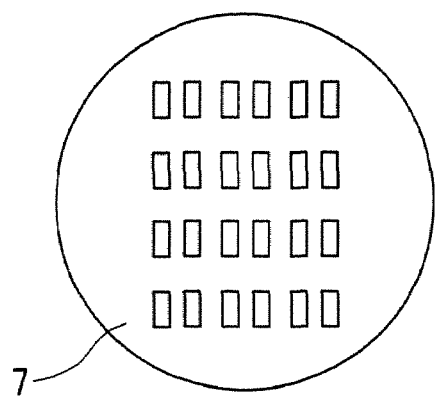
FIG. 41 is a plan view of a metal mask used for providing the conventional semiconductor device.
Figure 42:
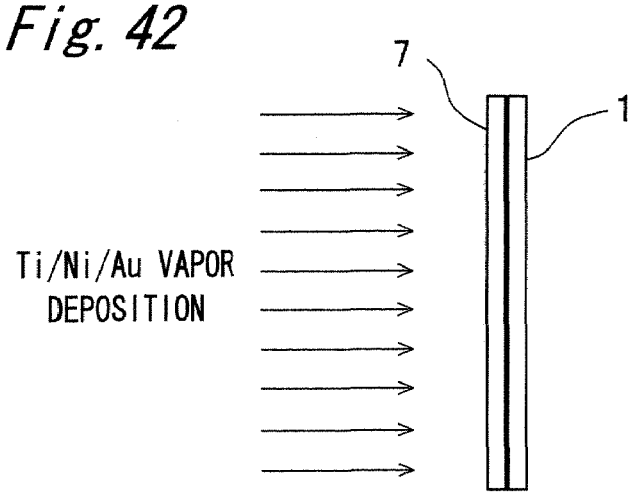
FIG. 42 is a schematic view illustrating the structure of the metal mask overlaid on the semiconductor wafer for vapor-depositing the metal film.
Figure 43:
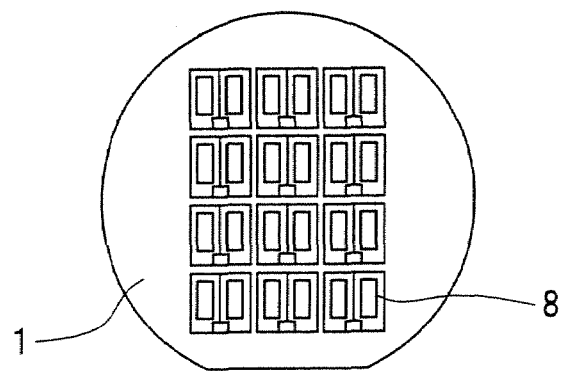
FIG. 43 is a plan view of the semiconductor wafer of the conventional semiconductor device, after the vapor deposition of a metal film, during fabrication thereof.
Figure 44:
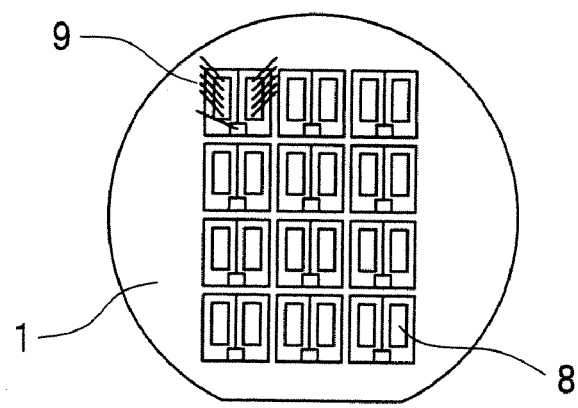
FIG. 44 is a schematic view illustrating the needle contact state of probe needles on the semiconductor wafer during the probe test.
Figure 45:
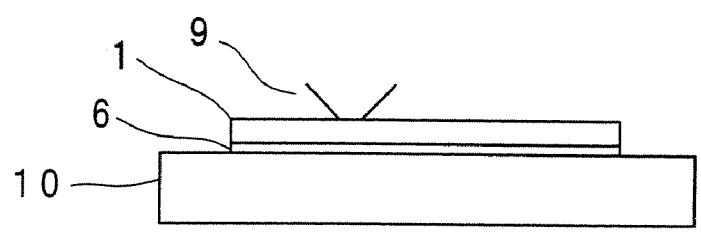
FIG. 45 is a cross-sectional view illustrating the needle contact state of FIG. 44.
Figure 46:
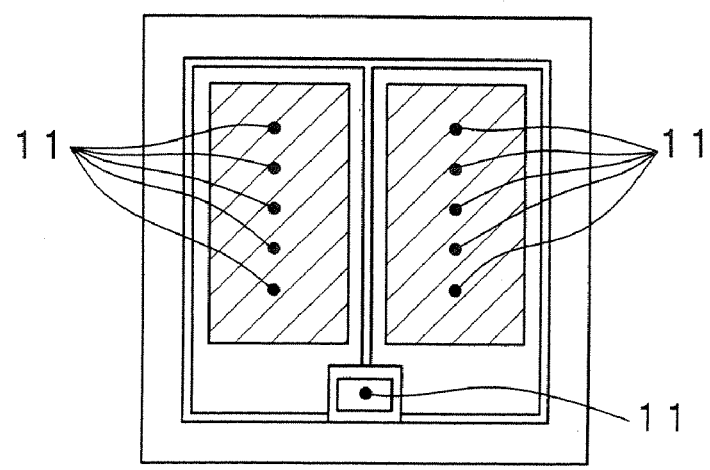
FIG. 46 is a plan view of the conventional semiconductor device, after the probe test.
Figure 47:
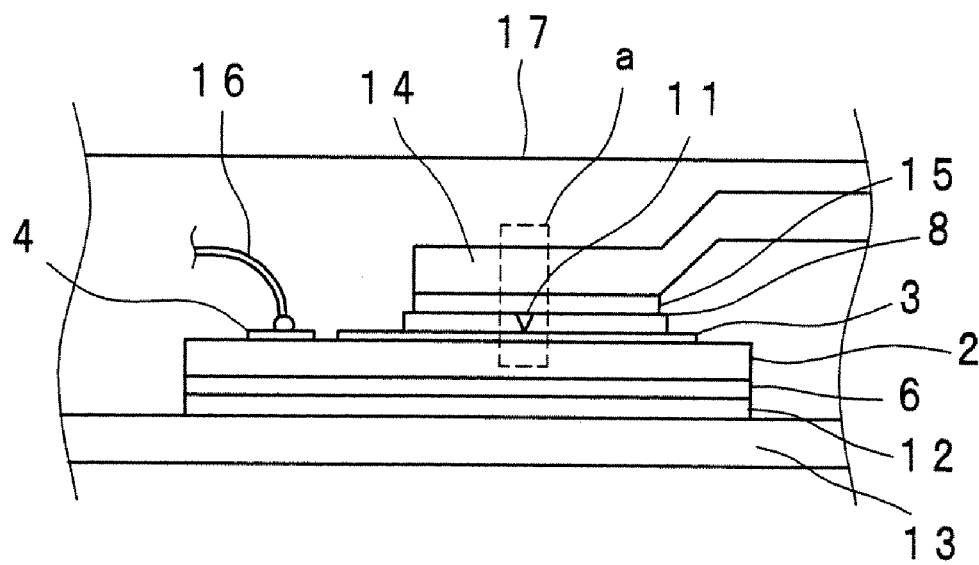
FIG. 47 is a partial cross-sectional view of an electric-power semiconductor product fabricated using the conventional semiconductor device.
Figure 48:
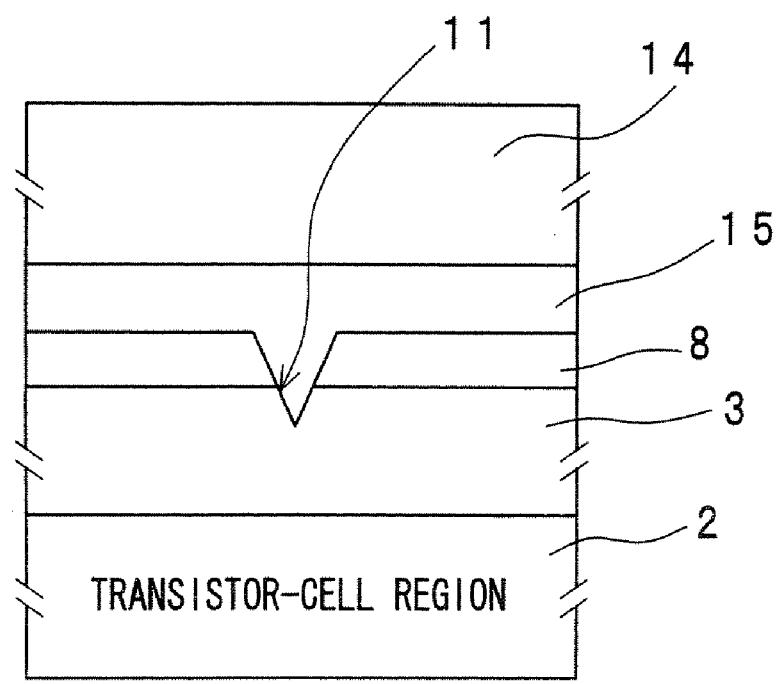
FIG. 48 is a partial cross-sectional enlarged view of the probe trace portion "a" of FIG. 47.

(3) While, in the aforementioned embodiments, probe needles are employed for the probe test, it is possible to employ pin-type probes as illustrated in FIG. 37. By employing such pin-type probes, it is possible to provide the advantages of alleviation of probe traces formed on the emitter electrodes, an increase of the amount of electric current which can be flowed through a single probe and reduction of the number of probes.

The semiconductor devices according to the present invention may be employed as semiconductor devices suitable for the direct-lead-bonding method.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A semiconductor device having a structure capable of connecting a lead terminal directly to an electrode on a front surface thereof, the semiconductor device comprising:
   a first main electrode provided on the front surface;
   a second main electrode provided on a back surface; and
   a metal film provided so as to cover at least a portion of a main surface of the first main electrode and for soldering the lead terminal thereto, the first main electrode being sandwiched between the second main electrode and the metal film,
   wherein the metal film has a plurality of opening portions through which the main surface of the first main electrode is exposed, and the opening portions are within the metal film.

2. A semiconductor device having a structure capable of connecting a lead terminal directly to an electrode on a front surface thereof, the semiconductor device comprising:
   a first main electrode provided on the front surface;
   a second main electrode provided on a back surface; and
   a metal film provided so as to cover at least a portion of a main surface of the first main electrode and for soldering the lead terminal thereto, the first main electrode being sandwiched between the second main electrode and the metal film, wherein the metal film includes an outermost profile line having at least one recessed portion.

3. A semiconductor device having a structure capable of connecting a lead terminal directly to an electrode on a front surface thereof, the semiconductor device comprising:

a first main electrode provided on the front surface;

a second main electrode provided on a back surface; and a metal film provided so as to cover at least a portion of a main surface of the first main electrode and for soldering the lead terminal thereto, the first main electrode being sandwiched between the second main electrode and the metal film, wherein at least one corner portion of the surface of the first main electrode is exposed without being covered with the metal film.

4. The semiconductor device according to claim 1, further comprising at least one controlling electrode on the front surface.

5. The semiconductor device according to claim 1, further comprising a surface protective film that covers at least a portion of a region of the surface of the first main electrode that is not covered with the metal film.

6. The semiconductor device according to claim 1, wherein each of the opening portions has an area equal to or greater than 10,000 $\mu m^2$.

7. The semiconductor device according to claim 1, wherein the opening portions are positioned in continuity with each other.

8. The semiconductor device according to claim 1, wherein the opening portions are positioned in a straight line.

9. An electric-power semiconductor product comprising:

a semiconductor device having a structure capable of connecting a lead terminal directly to an electrode on a front surface thereof, the semiconductor device comprising:

a first main electrode provided on the front surface;

a second main electrode provided on a back surface; and a metal film provided so as to cover at least a portion of a main surface of the first main electrode and for soldering the lead terminal thereto, the first main electrode being sandwiched between the second main electrode and the metal film, wherein the metal film has a plurality of opening portions through which the surface of the first main electrode is exposed, and the opening portions are within the metal film; and a lead terminal bonded to the first main electrode in a direct-lead-bonding manner via the metal film, while an upper part of the region of the surface of the first main electrode of the semiconductor device that is not covered with the metal film being exposed.

* * * * *